United States Patent
Ikegami et al.

(10) Patent No.: US 8,288,022 B2
(45) Date of Patent: Oct. 16, 2012

(54) PEROVSKITE PHOSPHOR FILM

(75) Inventors: Keiichi Ikegami, Ushiku (JP); Hiroshi Takashima, Tsukuba (JP); Takeo Ebina, Sendai (JP); Hiroyuki Tetsuka, Aichi (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/055,064

(22) PCT Filed: Jul. 17, 2009

(86) PCT No.: PCT/JP2009/062942
§ 371 (c)(1),
(2), (4) Date: Feb. 17, 2011

(87) PCT Pub. No.: WO2010/013607
PCT Pub. Date: Feb. 4, 2010

(65) Prior Publication Data
US 2011/0143144 A1    Jun. 16, 2011

(30) Foreign Application Priority Data

Jul. 27, 2008  (JP) ................. 2008-192925
Jun. 14, 2009  (JP) ................. 2009-141730

(51) Int. Cl.
*B32B 15/04* (2006.01)
*B01D 9/02* (2006.01)
*B05D 1/18* (2006.01)

(52) U.S. Cl. ........ 428/701; 428/697; 428/702; 428/432; 23/295 R; 23/301; 427/419.2; 427/419.3

(58) Field of Classification Search .............. 428/432, 428/697, 699, 701, 702; 23/295 R, 301; 427/419.1, 419.2, 419.3
See application file for complete search history.

(56) References Cited

U.S. PATENT DOCUMENTS
2008/0044590 A1    2/2008 Tsuchiya et al.

FOREIGN PATENT DOCUMENTS
JP    2008-075073 A    4/2008

OTHER PUBLICATIONS

Imai, Takaki, "Preparation of $SrAl_2O_4$ Thin Films deposited on an aluminum oxide underlayer" Dai 52 Kai Extended Abstracts, Japan Society of Applied Physics and Related Societies, 2005 p. 732.
Shibata, Tatsuo, et al., "One-Nanometer-Thick Seed Layer of Unilamellar Nanosheets Promotes Oriented Growth of Oxide Crystal Films," Advanced Materials, Jan. 2008, pp. 231-235, vol. 20.
Yamaki, Tetsuya, et al., "Alternate Multilayer Deposition from Ammonium Amphipiles and Titanium Dioxide Crytalline Nanosheets Using the Langmuir-Blodgett Technique," Langmuir, 2001, pp. 2564-2567, vol. 17.
Umemura, Yasushi, et al., "Photocatalytic Decomposition of an Alkylammonium Cation in a Langmuir-Blodgett Film of a Titania Nanosheet," Langmuir, 2006, pp. 3870-3877, vol. 22.

*Primary Examiner* — Jennifer McNeil
*Assistant Examiner* — Lauren Robinson
(74) *Attorney, Agent, or Firm* — Sughrue Mion, PLLC

(57) ABSTRACT

A perovskite phosphor film emitting red light from among the three primary colors (i.e., red, green and blue) underlying the construction of displays which is fabricated by adsorbing a nanosheet as a seed layer on a solid substrate and forming an oriented film of an oxide phosphor thereon, characterized in that the perovskite phosphor film comprises a film of an oxide phosphor (3) having a high transparency that is formed on a seed layer comprising a nanosheet (2) that is adsorbed on a solid substrate (1) such as a glass substrate or the like, and the oxide phosphor (3) is $(Sr_xCa_{1-x})_{1-y}Pr_yTiO_3$: $0 \leq x \leq 0.8$, $0.001 \leq y \leq 0.01$.

7 Claims, 4 Drawing Sheets

PEROVSKITE PHOSPHOR FILM

TECHNICAL FIELD

The present invention relates to a perovskite phosphor thin film, and more particularly, to a highly transparent perovskite phosphor thin film which can be formed in a large area on a base material such as a solid substrate.

BACKGROUND ART

A large number of phosphors, including organic electroluminescent (EL) materials and inorganic EL materials, have hitherto been put to practical use. However, these phosphors have their crystallinity lowered mainly due to oxidation and humidification, and deterioration of the fluorescence properties with a lapse of time is noticeable. Industrial products making use of phosphors having such short lifetimes are well adapted to the mass consumption society where throwaway is considered as a virtue, but such industrial products cause a serious problem from the viewpoint of resource saving. Furthermore, in order to apply phosphors to illuminations, light sources or displays, it is imperative to realize low voltage driving from the viewpoint of energy saving. On the other hand, although practicalization has not yet been achieved, it is known that oxide polycrystals achieve a good balance between fluorescence properties and robust chemical stability. Furthermore, it is becoming obvious that when an oxide phosphor is incorporated into an EL element as a high quality thin film, the EL element can be expected to be driven at a low voltage such as about 10 V, unlike the case of other inorganic EL materials. Furthermore, area enlargement is necessary in general illumination and display applications.

Therefore, in order to increase the national economic and social sustainability by means of energy saving and resource saving, it is an urgent task to develop a technology which enables production of a high quality oxide phosphor thin film having fluorescence properties that can withstand practicalization, in a large area. A polycrystalline thin film formed of aggregates of three-dimensionally random crystals exhibit fluorescence properties, but since the intensity is very weak, it is necessary to obtain high intensity fluorescence by growing an oriented film with high crystallinity. Furthermore, because oxide phosphors have high transparency, the oxide phosphors are expected to be used as displays utilizing windows. However, in order to realize the expectations, it is needed to produce an oxide phosphor thin film on a transparent and inexpensive base material.

Non-Patent Document 1 discloses that a Langmuir-Blodgett film (LB film) of nanosheets composed of $Ca_2Nb_3O_{10}$ is obtained on a glass substrate. Furthermore, Non-Patent Document 2 discloses that a crystalline thin film of $SrTiO_3$ is obtained on a glass substrate by making an LB film of nanosheets composed of $Ca_2Nb_3O_{10}$ into a seed layer. Furthermore, Non-Patent Document 3 discloses the red fluorescence properties of a polycrystalline layered perovskite $Sr_{n+1}TiO_{3n+1}$ system. Non-Patent Document 4 discloses blue white fluorescence caused by oxygen deficiency in connection with $SrTiO_3$ monocrystal and thin film. Non-Patent Document 5 discloses that red fluorescence properties are obtained by substituting polycrystal $SrTiO_3$ with Pr atoms. Furthermore, Non-Patent Document 6 discloses red fluorescence properties of polycrystal Pr atom-substituted (CaSrBa)$TiO_3$. Non-Patent Documents 7 and 8 disclose that an LB film of nanosheets composed of titanium dioxide and a cationic surfactant is obtained on a solid substrate.

Furthermore, Patent Document 1 discloses a method for producing a composite oxide phosphor thin film produced by substituting an inorganic parent material such as yttrium aluminate with metal ions. Patent Document 2 discloses fluorescence properties of a polycrystal Sn perovskite oxide system. Furthermore, Patent Document 3 discloses that red fluorescence is obtained with an epitaxial thin film of $SrTiO_3$ substituted with Pr and Al atoms. Patent Document 4 discloses an EL element utilizing an oxide phosphor epitaxial thin film as a light emitting layer. Furthermore, Patent Document 5 discloses that a crystalline thin film of $SrTiO_3$ is obtained on a glass substrate by making an LB film of nanosheets composed of $Ca_2Nb_3O_{10}$ as a seed layer.

PRIOR ART DOCUMENTS

Patent Documents

Patent Document 1: Japanese Patent Application Laid-Open (JP-A) No. 2003-183646
Patent Document 2: Japanese Patent Application No. 2005-322286
Patent Document 3: Japanese Patent Application No. 2007-332106
Patent Document 4: Japanese Patent Application No. 2008-037038
Patent Document 5: Japanese Patent Application No. 2009-062216

Non-Patent Documents

Non-Patent Document 1: Langmuir Vol. 21, 6590 (2005)
Non-Patent Document 2: Adv. Mater. 2008, 20, 231-235
Non-Patent Document 3: J. J. Appl. Phys. Vol. 44, pp. 761-764 (2005)
Non-Patent Document 4 : Nature Materials Vol. 4, 816 (2005) SrTiO3
Non-Patent Document 5: Appl. Phy. Lett Vol. 78, 655 (2001)
Non-Patent Document 6: Chem. Mater. Vol. 17, 3200 (2005)
Non-Patent Document 7: Langmuir Vol. 17, 2564 (2001)
Non-Patent Document 8: Langmuir Vol. 22, 3870 (2006)

DISCLOSURE OF THE INVENTION

Problem to be Solved by the Invention

In the following description, focus will be on a perovskite material having an LB film of nanosheets produced thereon as a seed layer, and problems of the related art will be described. In regard to Non-Patent Document 2, the source of nanosheets composed of $Ca_2Nb_3O_{10}$ that are transferred as an LB film onto the surface of a solid substrate, is a colloid suspension of a relatively high concentration such as 80 mg/L, which is placed in a trough(Langmuir trough)as a subphase. This produces a Langmuir film which serves as the precursor of a seed layer on the water surface, by utilizing the electrostatic repulsive force that works between the nanosheets of $Ca_2Nb_3O_{10}$, which is a polyanion, and the weak amphiphilic property prossessed by tetrabutylammonium that is present in the suspension as a counter cation. However, in this method, when the Langmuir film is transferred onto the surface of a solid substrate as an LB film, very many nanosheets composed of $Ca_2Nb_3O_{10}$ remain in the subphase even after the seed layer is produced, so that when this lower layer water is treated as drainage water, a problem is posed from the viewpoint of resource saving and environment preservation.

Furthermore, in the Langmuir film of nanosheets composed of $Ca_2Nb_3O_{10}$ that is used in the Non-Patent Document 2, an electrostatic repulsive force works between the nanosheets even within the Langmuir film, and therefore, there is a possibility that the film structure may be destroyed when transferred onto the base material surface. Thus, the stability as a production method is insufficient (the area-surface pressure curve shown in FIG. 9 of the Non-Patent Document 1 suggests that an electrostatic repulsive force works between the nanosheets produced by the method of the Non-Patent Document 1 or Non-Patent Document 2). On the contrary, in the case of forming a seed layer using a Langmuir film of nanosheets composed of $Ca_2Nb_3O_{10}$ and a cationic surfactant, since a large van der Waals force (attractive force) works between the long-chain alkyl groups of the surfactant molecules, the Langmuir film is difficult to collapse, and the stability as a production method is enhanced. In fact, a Langmuir film of nanosheets composed only of $Ca_2Nb_3O_{10}$ is collapsed at a low surface pressure of about 10 mN/m, but a Langmuir film of nanosheets composed of a cationic surfactant and $Ca_2Nb_3O_{10}$ can withstand a high surface pressure of about 60 mN/m. In general, in the case of transferring a Langmuir film onto the surface of a base material, the transfer becomes stable when the surface pressure applied to the Langmuir film is increased, and it is also easy to transfer even to the surface of a base material having weak adsorptive force to the Langmuir film. Therefore, a seed layer can be produced more stably on many types of base materials according to the present method.

Furthermore, since the Langmuir film of nanosheets composed of $Ca_2Nb_3O_{10}$ used in the Non-Patent Document 2 is colorless and transparent, when this Langmuir film is transferred to a large-size base material, it is very difficult to verify whether the Langmuir film is uniformly adsorbed without unevenness. When a colored substance such as a long-chain alkyl-substituted cyanine dye is used as the cationic surfactant mentioned above, it can be conveniently discriminated by visual inspection whether or not the transfer of the Langmuir film has been carried out without any problem.

In the Non-Patent Document 2, a Langmuir film composed of nanosheets using a vertical lifting method (Langmuir-Blodgett method) is transferred onto the surface of a solid substrate. However, in this method, if the affinity between the solid substrate surface and the nanosheets is not sufficiently large, the Langmuir film slides off during the transfer under the effect of gravity, and a homogeneous seed layer cannot be obtained, while the stability as a production method is insufficient. Furthermore, in the Non-Patent Document 2, $SrTiO_3$ having a lattice constant of 0.3905 nm is laminated on $Ca_2Nb_3O_{10}$ having a lattice constant of 0.386 nm, but since the lattice constants of the two do not match, distortion occurs in the $SrTiO_3$ layer as an upper structure, and this is a factor causing a decrease in the crystallinity.

Furthermore, in the Non-Patent Document 2, $SrTiO_3$ is laminated on a seed layer composed of nanosheets of $Ca_2Nb_3O_{10}$, but fluorescence properties cannot be obtained with this material. That is, the Non-Patent Document 2 discloses that $SrTiO_3$ was obtained on a glass substrate using the nanosheets as a seed layer, but does not disclose that fluorescence was obtained.

Under the circumstances of the various problems described above, an object of the present invention is to provide a perovskite phosphor thin film which emits red light from among the primary colors of red, green and blue, and underlies the construction of displays, by adsorbing nanosheets as a seed layer onto a base material such as a glass substrate and producing thereon an oriented film of an oxide phosphor having high transparency.

Means for Solving Problem

The present invention has employed the following means in order to solve the problems described above. A first means is a perovskite phosphor thin film, obtained by forming a film of an oxide phosphor composed of $(Sr_xCa_{1-x})_{1-y}Pr_yTiO_3$: $0 \leq x \leq 0.8$ and $0.001 \leq y \leq 0.01$, on a seed layer composed of a nanosheet adsorbed on the surface of a base material.

A second means is the perovskite phosphor thin film according to the first means, wherein the base material is a glass substrate.

A third means is the perovskite phosphor thin film according to the first or second means, wherein the nanosheet is composed of $Ca_2Nb_3O_{10}$.

A fourth means is the perovskite phosphor thin film according to the first or second means, wherein the nanosheet is composed of $Ca_2Nb_3O_{10}$ which is obtained by eliminating a cationic surfactant from a composite nanosheet composed of $Ca_2Nb_3O_{10}$ and a cationic surfactant.

A fifth means is the perovskite phosphor thin film according to the fourth means, wherein the cationic surfactant is colored.

A sixth means is the perovskite phosphor thin film according to any one of the first to fifth means, wherein the ratio Sr/Ca of the $(Sr_xCa_{1-x})_{1-y}Pr_yTiO_3$: $0 \leq x \leq 0.8$ and $0.001 \leq y \leq 0.01$ is adjusted to make the lattice constant of $(Sr_xCa_{1-x})_{1-y}Pr_yTiO_3$ and the lattice constant of $Ca_2Nb_3O_{10}$ to be consistent with each other.

A seventh means is the perovskite phosphor thin film according to any one of the first to sixth means, wherein the nanosheet is adsorbed onto the base material according to a quasi-horizontal lifting method.

An eighth means is the perovskite phosphor thin film according to any one of the first to seventh means, wherein the transmittance of the perovskite phosphor thin film is 70% or higher.

Effect of the Invention

According to the present invention, a thin film device of a large area having excellent fluorescence properties for red color was obtained by using an oriented film of not a polycrystal having low crystallinity but of an oxide having high crystallinity, in order to obtain high fluorescence intensity. Red color is one of the three primary colors together with green and blue, and is indispensable for illumination light sources having high color rendering properties, or for displays having good color reproducibility. Therefore, the development of an electroluminescent (EL) device based on an oxide oriented film is expected. Furthermore, since an EL device using a high quality thin film can be driven at low voltage, energy saving and miniaturization of the system are made possible. Also, when an oxide is used, the deterioration of crystallinity due to exposure to the atmosphere occurs to a very small extent, and lifetime extension of the products is made possible, so that resource saving is consequently made possible. In addition, since perovskite phosphor thin films have a transmission of 70% or higher, they are suitable for the use as window displays.

BEST MODE(S) FOR CARRYING OUT THE INVENTION

Figure 1:
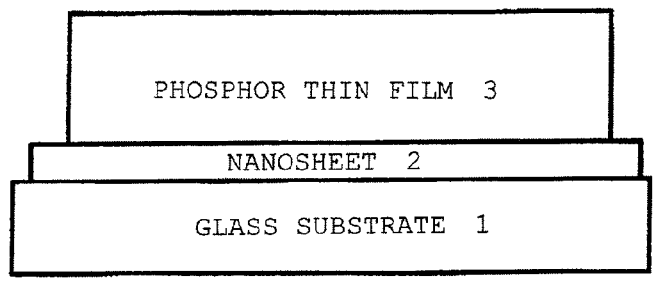
FIG. 1 is a diagram showing the schematic configuration of a perovskite phosphor thin film related to the present invention.

According to the present invention, a nanosheet is uniformly adsorbed in a large area on a glass substrate by a quasi-horizontal lifting method, and thereby a seed layer formed from aggregates of uniaxially oriented plate-shaped crystals, is obtained. Among the constituent elements of these plate-shaped crystals, the part functioning as the seed layer during the production of a phosphor thin film is a part obtainable by peeling an inorganic layered compound. However, it is important to make the thickness perfectly uniform by performing the peeling for every layer, and it is desirable that the thickness×nm is in the range of $0.3<x<5$. Furthermore, if the plate-shaped crystals are too small, the phosphor crystals that are grown thereon also become small, so that fluorescent light emission cannot be obtained. On the other hand, if the plate-shaped crystals were too large, the base material surface cannot be embedded without any gaps. Therefore, it is desirable that the size y nm² of the plate-shaped crystals is in the range of $10^2<y<1000^2$. Next, an oriented film of an oxide phosphor is produced on the plate-shaped crystals by vapor phase epitaxy or liquid phase epitaxy, and subsequently the oriented film is subjected to an appropriate post-treatment to thereby obtain a pervoskite phosphor thin film having an oriented film having excellent fluorescence properties. Thereby, red color maybe obtained, among the three primary colors of red, green and blue that underlie the construction of displays.

A more specific method for producing the perovskite phosphor thin film of the present invention involves production of a monolayer film of a cationic surfactant on a colloid suspension of a nanosheet composed of $Ca_2Nb_3O_{10}$ placed in a Langmuir trough. Thereby, a composite nanosheet is produced by the electrostatic attractive force that works between the cationic surfactant and $Ca_2Nb_3O_{10}$, and the nanosheet is adsorbed to the air-water interface by the surfactant potency possessed by the cationic surfactant, to thereby form a Langmuir film. Thus, the concentration of $Ca_2Nb_3O_{10}$ in the subphase can be reduced to 1/10 or less. Since a large van der Waals force (attractive force) works between the long-chain alkyl groups of the surfactant molecules, the Langmuir film is difficult to collapse. Accordingly, a state with high surface pressure can exist in an equilibrium state, so that the formation of a seed layer can be carried out even on a base material having relatively low affinity with the nanosheet, by performing the transfer onto the base material surface at a high surface pressure.

When a Langmuir film is transferred onto a base material such as a glass substrate, use is made not of a vertical lifting method, but of a quasi-horizontal lifting method in which a base material that has been previously submerged in water in a state of being slightly slanted from the horizon, is lifted up while maintaining a predetermined angle. Thereby, the Langmuir film is prevented from sliding under the effect of gravity, and production of a seed layer on the surface of a base material that does not have sufficiently high affinity with the nanosheet, is made possible.

As an upper structure, mixed crystalline $(Sr_xCa_{1-x})_{1-y}Pr_yTiO_3$ is laminated. At this time, this mixed crystal is imparted with fluorescence properties by setting the ranges of x and y at $0 \leq x \leq 0.8$ and $0.001 \leq y \leq 0.01$. Furthermore, since Sr and Ca have different ionic radii, it is possible to accurately control the lattice constant by adjusting the Sr/Ca ratio for this mixed crystal. When the lattice constant is adjusted to 0.386 nm, which is consistent with the lattice constant of the seed layer, by setting x at 0.4, an epitaxial growth film of very high quality can be obtained. Furthermore, in order to obtain the best fluorescence properties under the conditions of x=0.4, y is set at 0.002. Thereby, there is obtained a pervoskite phosphor thin film in which a perovskite thin film exhibiting fluorescence and having high crystallinity is formed on a seed layer.

EXAMPLES

Hereinafter, the present invention will be described by way of Examples. FIG. 1 is a diagram showing the schematic configuration of a perovskite phosphor thin film according to the present invention. As shown in the same drawing, a perovskite phosphor thin film was obtained by physically adsorbing a nanosheet 2 composed of a Nb-based oxide having a perovskite-related structure and a cationic surfactant on a glass substrate 1 according to a quasi-horizontal lifting method to provide a seed layer, growing a $(Sr_{0.4}Ca_{0.6})_{0.998}Pr_{0.002}TiO_3$ film by vapor phase epitaxy on top of this seed layer, and forming a phosphor thin film 3 having high crystallinity.

Figure 2:
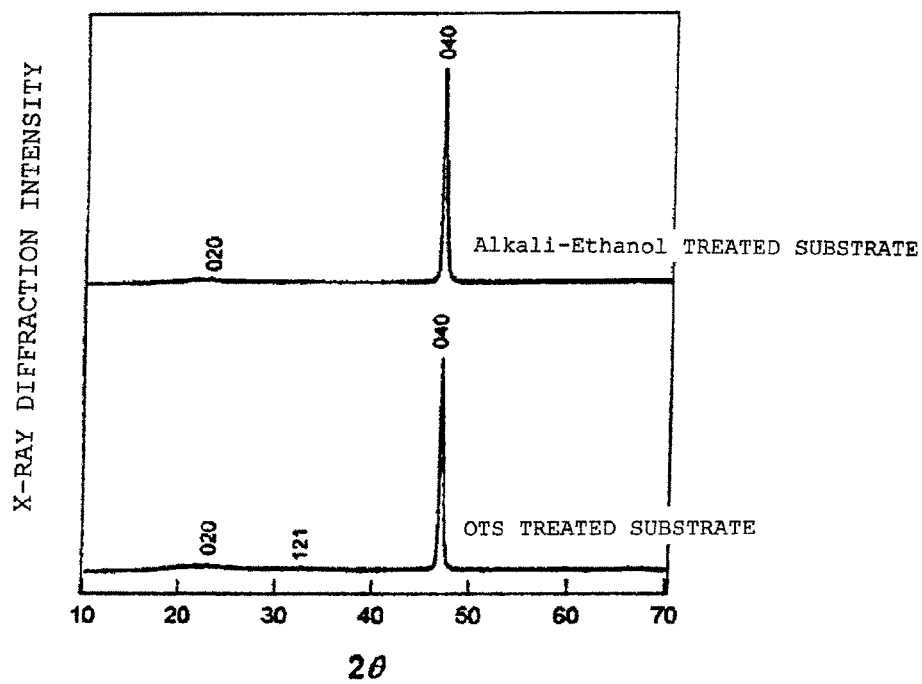
FIG. 2 is a diagram showing the results of an X-ray analysis of a perovskite phosphor thin film.

FIG. 2 is a diagram showing the results of an X-ray analysis of a perovskite phosphor thin film. As shown in the same drawing, it is obvious that a c axis-oriented phosphor thin film has grown, and it is shown that the crystallinity of the phosphor thin film is enhanced by this uniaxial orientation property.

Figure 3:
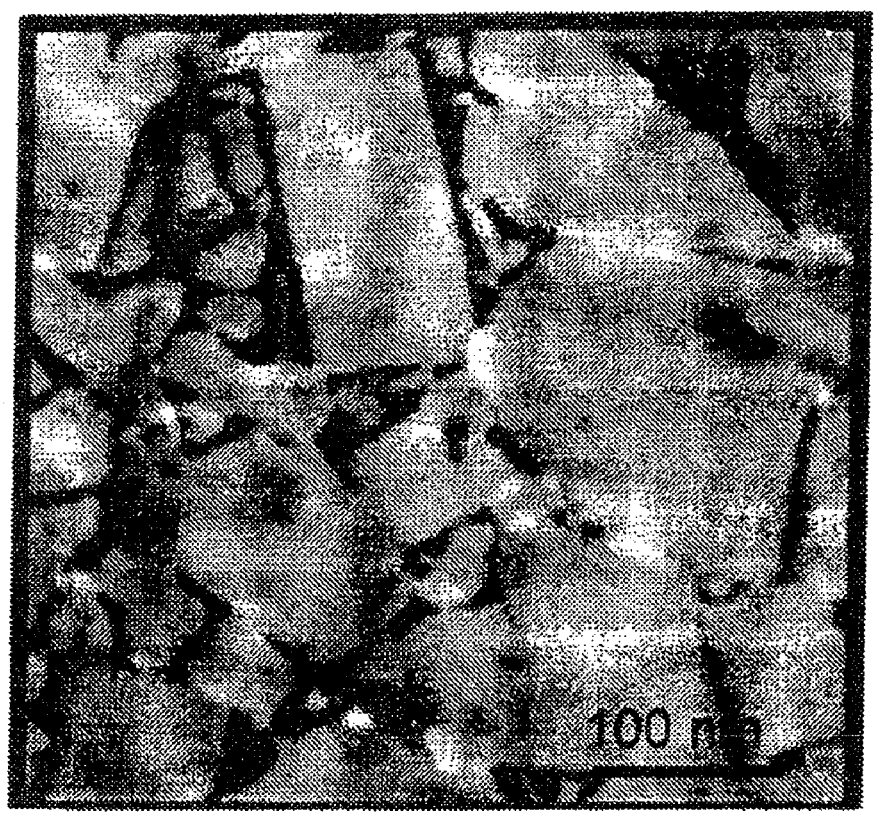
FIG. 3 is a diagram showing an atomic force micrograph of a seed layer.

FIG. 3 is a diagram showing an atomic force micrograph of a seed layer. As shown in the same diagram, it can be seen that a nanosheet of about 100 nm having a rectangular shape is uniformly adsorbed on a glass substrate. The seed layer has a shape of a c axis-oriented monocrystalline sheet, and has an in-plane ab axis.

Figure 4:
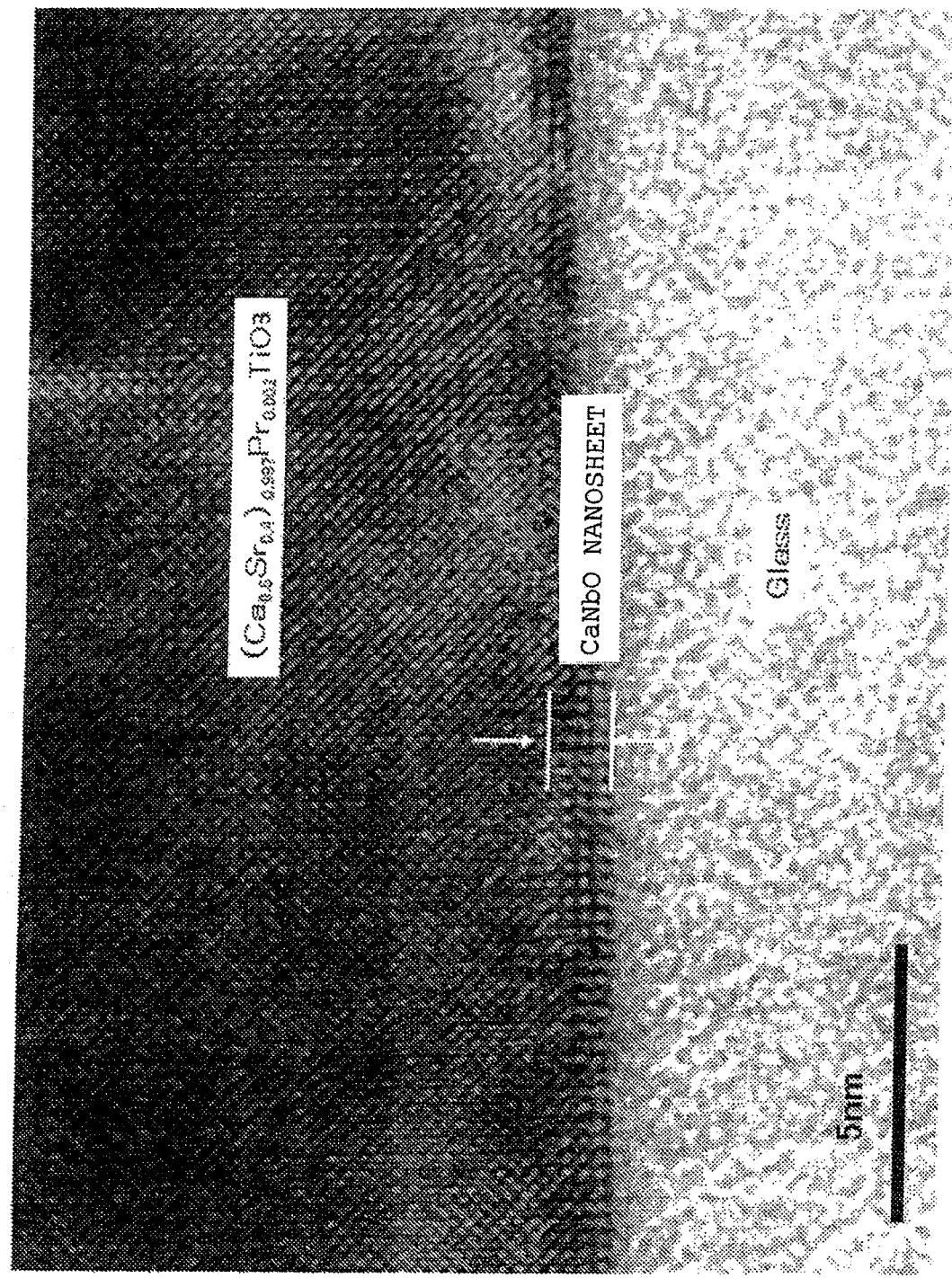
FIG. 4 is a diagram showing a cross-sectional TEM photograph of a structure obtained by adsorbing a seed layer on a glass substrate and then growing $(Sr_{0.4}Ca_{0.6})_{0.998}Pr_{0.002}TiO_3$ by a vapor phase method.

FIG. 4 is a diagram showing a cross-sectional TEM photograph of a structure obtained by forming a seed layer on a glass substrate and then growing $(Sr_{0.4}Ca_{0.6})_{0.998}Pr_{0.002}TiO_3$ by a vapor phase method. As shown in the same diagram, the atomic alignment of a nanosheet of approximately 1 nm on a glass substrate is observed, and it can be seen that a phosphor thin film $(Sr_{0.4}Ca_{0.6})_{0.998}Pr_{0.002}TiO_3$ has grown on top of the nanosheet in an atomically oriented manner. It can be seen that the interface is aligned in the atomic order, and a lattice arrangement of very high quality is achieved.

Figure 5:
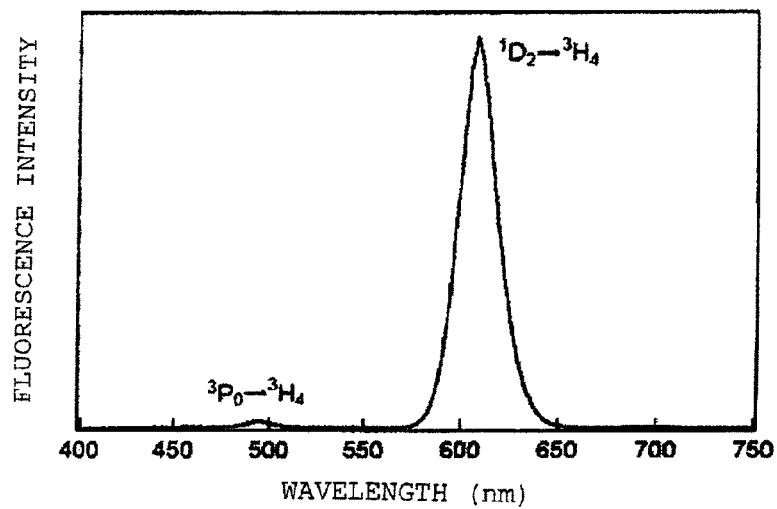
FIG. 5 is a diagram showing the results obtained when a fluorescent oriented film that had been vapor-grown on top of a nanosheet, was irradiated with ultraviolet radiation using a lamp having a wavelength of 254 nm.

FIG. 5 is a diagram showing the results obtained when a fluorescent oriented film that had been vapor-grown on top of a nanosheet composed of $Ca_2Nb_3O_{10}$ and a cationic surfactant according to the present invention, was irradiated with ultraviolet radiation using a lamp having a wavelength of 254 nm. As shown in the same drawing, red fluorescence is exhibited, and a precipitous peak was confirmed near the wavelength of 610 nm. When a nanosheet was used, the sample had high transparency, and fluorescence could be confirmed by visual inspection. On the other hand, the sample in which film formation was performed directly on a glass substrate, did not exhibit significant fluorescence, and it was found that the fluorescence intensity was weak in low resolution crystals while the fluorescence intensity was strong in high resolution crystals. The dielectric substance (SrCa)$TiO_3$ has the same crystal structure as the phosphor $(Sr_{0.4}Ca_{0.6})_{0.998}Pr_{0.002}TiO_3$, and the lattice constant is almost the same. Therefore, a $SrTiO_3$ oriented film is realized on the nanosheet by the same technique, and thus it is anticipated to obtain a dielectric constant higher than that of a polycrystal that has been formed into a film directly on a glass substrate. Thereby, it is expected that when a nanosheet is used as a seed layer, and a dielectric fluorescent thin film is grown on top of the nanosheet, an electroluminescent element with high luminance which is driven at low voltage, can be obtained on a glass substrate at low cost.

Figure 6:
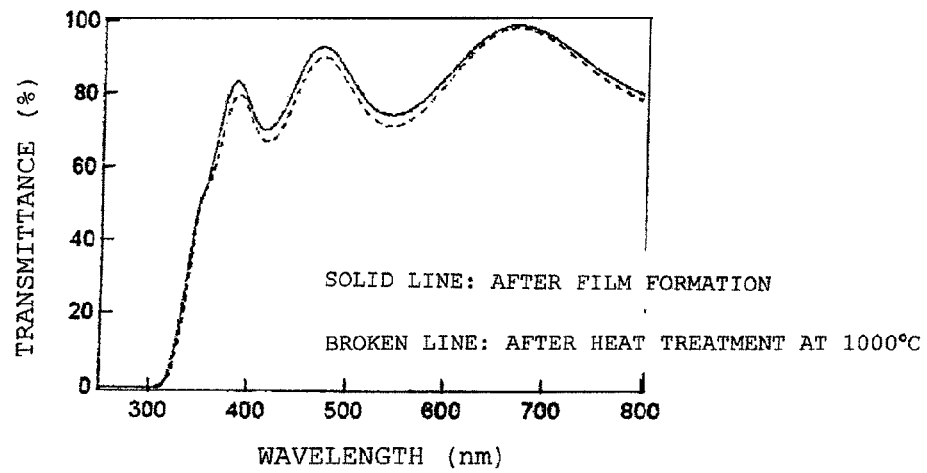
FIG. 6 is a diagram showing the transmittances obtained after the growth of a fluorescent oriented film that had been vapor-grown on top of a nanosheet, and after a heat treatment at 1000° C.

FIG. 6 shows the transmittance after growth (solid line) of the fluorescent oriented film that has been vapor-grown on top of the nanosheet according to the present invention, and the transmittance of the thin film that has been subjected to a heat treatment at 1000° C. (broken line). As shown in the same diagram, both samples showed a transmittance of 70% or higher in the wavelength range of 310 nm to 800 nm, and thus it was found that the fluorescent oriented film that had been vapor-grown on top of the nanosheet according to the present invention had high transparency in the visible region. As a result, it is found to be suitable to use the fluorescent oriented film as a window display device as a visible light display.

Hereinafter, the production method that was actually used in the Example described above will be described. (A) In order to carry out the production of a perovskite phosphor thin film according to the present invention, a seed layer was produced on a solid base material by the following method. First, a suspension of $Ca_2Nb_3O_{10}$ was obtained at a concentration of 2 g/L by subjecting the crystals of $KCa_2Nb_3O_{10}$ produced by a solid phase reaction method, sequentially to nitric acid and tetrabutylammonium bromide.

Next, pure water was added to this suspension to dilute the suspension to 0.008 g/L, and the diluted suspension was introduced into a Langmuir trough. A glass substrate as a solid base material, which had the surface washed in advance with alkaline ethanol, was submerged in that diluted suspension, and then a chloroform solution of dioctadecyldimethylammonium (DOA) bromide prepared to a concentration of 0.001 mol/L was added dropwise on the water surface. The area of the water surface was narrowed until the surface pressure reached 0.045 N/m, and thereby an LB film of a nanosheet composed of $Ca_2Nb_3O_{10}$ and a cationic surfactant was obtained in a two-dimensional solid state. After the area of the water surface was stabilized, the glass substrate was lifted up while a slope of about 30° from the horizon was maintained, and thereby an LB film was transferred onto the glass substrate.

(B) In the production of the perovskite phosphor thin film according to the present invention, a pulse laser deposition method was used. The pulse laser deposition method is a technique of irradiating an excimer laser light of ArF (wavelength 193 nm), thereby plasmatizing a target material, forming a plume, disposing a solid base material heated on the surface facing the target material, and thus depositing a thin film.

In regard to the production of the perovskite phosphor thin film according to the present invention, the glass substrate to which the LB film of the nanosheet composed of $Ca_2Nb_3O_{10}$ and a cationic surfactant prepared in step (A) had been transferred, was used as a solid base material. A $(Sr_{0.4}Ca_{0.6})TiO_3$:Pr polycrystal having a stoichiometric composition was used as the target material. The distance between the target and the solid base material was 30 mm, and the solid base material was heated to 700° C. The laser irradiation frequency was 8 Hz, and the laser energy was about 120 mJ. Furthermore, an atmosphere of oxygen at a low pressure of 1 Torr or less at 1000° C. or lower was used, and the time taken by film formation was 30 minutes.

Furthermore, in regard to the production of the perovskite phosphor thin film according to the present invention, since the film formation is carried out at 1000° C. or lower, cluster growth is dominant, and a film of the target material can be formed at its stoichiometric composition. Furthermore, since the target material is formed of an oxide, when the film formation is carried out in an oxygen atmosphere, deterioration of the electrical properties and fluorescence properties due to oxygen deficiency or the like can be drastically reduced. Furthermore, because the cationic surfactant in the LB film of the nanosheet composed of $Ca_2Nb_3O_{10}$ and a cationic surfactant that has been transferred onto a glass substrate in step (A), is oxidized and is thereby decomposed and evaporated, the $Ca_2Nb_3O_{10}$ plate-shaped crystals remaining behind are later brought into direct contact with the plume and function as a seed layer. The lattice constant of the $Ca_2Nb_3O_{10}$ plate-shaped crystal is 0.386 nm. Since a material having a large content of a perovskite oxide has a lattice constant approximating this value and has satisfactory lattice conformity, it is expected to grow an oxide oriented thin film having excellent crystallinity.

Hereinafter, the reason for setting the concentration of the $Ca_2Nb_3O_{10}$ suspension used in the Example described above at 0.008 g/L will be discussed. A first reason is that the time taken by the formation of a composite nanosheet composed of DOA and $Ca_2Nb_3O_{10}$ in the presence of DOA, which is a cationic surfactant, is reduced to a large extent, as compared with the time τ taken by the amount of the nanoshseet composed of $Ca_2Nb_3O_{10}$ adsorbed to the air-water interface in the absence of DOA, to reach an equilibrium. If the suspension concentration is low, τ is lengthened. Therefore, workability cannot be secured if the suspension concentration is not raised to about 0.08 g/L or greater in the absence of DOA; however, in the presence of DOA, sufficient workability is secured even at a concentration of 0.008 g/L.

A second reason is that when the suspension concentration is adjusted to 0.0004 to 0.008 g/L, the amount of adsorption of the CNO nanosheet is in just proportion with respect to the cross-sectional area of the DOA molecules. If the suspension concentration exceeds 0.008 g/L, a reduction in area due to the disintegration of the excessively adsorbed CNO nanosheet is observed even at a surface pressure of about 0.02 N/m. On the other hand, if the suspension concentration does not reach 0.0004 g/L, the film at the air-water interface is very soft, and particularly at a surface pressure of about 0.02 N/m or higher, there is observed a phenomenon in which the suspension slips through the divider that is moved in order to narrow the area of the water surface. This implies that the amount of adsorption of the CNO nanosheet is insufficient.

DESCRIPTION OF REFERENCE NUMERAL

1 Glass Substrate
2 Nanosheet
3 Phosphor Thin Film

The invention claimed is:

1. A perovskite phosphor thin film, comprising a film of an oxide phosphor composed of $(Sr_xCa_{1-x})_{1-y}Pr_yTiO_3$: $0 \leqq x \leqq 0.8$ and $0.001 \leqq y \leqq 0.01$, and a seed layer composed of a nanosheet adsorbed on the surface of a base material, wherein the crystallites in the film of the oxide phosphor are uniaxially oriented, and the transmittance of the perovskite phosphor film in the visible light region is 70% or higher, and wherein the nanosheet is composed of $Ca_2Nb_3O_{10}$.

2. The perovskite phosphor thin film according to claim 1, wherein the nanosheet before adsorbing on the surface of the base material is composed of $Ca_2Nb_3O_{10}$ and a cationic surfactant, and the nanosheet adsorbed on the surface of the base material is obtained by eliminating the cationic surfactant from the nanosheet.

3. The perovskite phosphor thin film according to claim 2, wherein the cationic surfactant is colored.

4. The perovskite phosphor thin film according to claim 1, wherein the ratio Sr/Ca of the $(Sr_xCa_{1-x})_{1-y}Pr_yTiO_3$: $0 \leqq x \leqq 0.8$ and $0.001 \leqq y \leqq 0.01$ is adjusted to make the lattice constant of $(Sr_xCa_{1-x})_{1-y}Pr_yTiO_3$ and the lattice constant of $Ca_2Nb_3O_{10}$ to be consistent with each other.

5. The perovskite phosphor thin film according to claim 1, wherein the nanosheet adsorbed on the surface of the base material is obtained by immersing the base material into a colloidal suspension of the nanosheet having a $Ca_2Nb_3O_{10}$ concentration of 0.004 to 0.008 g/L.

6. A method for producing the perovskite phosphor thin film according to claim 1, the method comprising a step of immersing a base material in a container containing a suspension of $Ca_2Nb_3O_{10}$ at a concentration of 0.004 to 0.008 g/L; a step of providing a monolayer film of a cationic surfactant on the suspension; a step of adsorbing $Ca_2Nb_3O_{10}$ onto the monolayer film to obtain a composite nanosheet; a step of compressing the composite nanosheet to a surface pressure of 0.02 to 0.05 N/m; a step of moving the base material upward while passing through the suspension surface, and thereby providing a seed layer formed from a composite nanosheet composed of $Ca_2Nb_3O_{10}$ and the cationic surfactant, on the surface of the base material; and a step of providing a perovskite phosphor layer composed of $(Sr_xCa_{1-x})_{1-y}Pr_yTiO_3$: $0<x<0.8$ and $0.001<y<0.01$, on the seed layer.

7. The method for producing a perovskite phosphor thin film according to claim 6, wherein the composite nanosheet is adsorbed onto the base material according to a quasi-level surface method.

* * * * *